United States Patent [19]

Morikawa et al.

[11] Patent Number: 5,379,230
[45] Date of Patent: Jan. 3, 1995

[54] SEMICONDUCTOR INTEGRATED CIRCUIT HAVING SEMICONDUCTOR OUTPUT DEVICE DRIVING EXTERNAL LOAD AND MICROPROCESSOR UNIT

[75] Inventors: Masatoshi Morikawa, Hachioji; Isao Yoshida, Tokyo; Terumi Sawase, Hannou; Kouzou Sakamoto, Hachioji; Takeaki Okabe, Tokyo, all of Japan

[73] Assignee: Hitachi, Ltd., Tokyo, Japan

[21] Appl. No.: 232,402

[22] Filed: Apr. 25, 1994

Related U.S. Application Data

[63] Continuation of Ser. No. 785,808, Oct. 31, 1991, abandoned.

[30] Foreign Application Priority Data

Nov. 2, 1990 [JP] Japan .................. 2-295320

[51] Int. Cl.$^6$ .................. G01K 7/00; H03K 17/12
[52] U.S. Cl. .................. 364/483; 364/489; 361/106; 361/101; 323/314; 327/108; 327/538; 327/512
[58] Field of Search ........... 364/483, 489, 490, 488; 361/106, 101, 54, 18, 103; 307/270, 296.6; 323/314; 377/42, 44, 46

[56] References Cited

U.S. PATENT DOCUMENTS

| | | | |
|---|---|---|---|
| 4,549,818 | 10/1985 | Nishikubo et al. | 374/178 |
| 4,675,777 | 6/1987 | Watrous | 361/106 |
| 4,703,390 | 10/1987 | Fay et al. | 361/101 |
| 4,907,117 | 3/1990 | Pease et al. | 361/54 |
| 4,924,111 | 5/1990 | Anderson et al. | 307/270 |
| 4,924,112 | 5/1990 | Anderson et al. | 307/270 |
| 4,937,697 | 6/1990 | Edwards et al. | 361/18 |
| 4,978,905 | 12/1990 | Hoff et al. | 323/314 |
| 5,073,838 | 12/1991 | Ames | 361/103 |
| 5,086,238 | 2/1992 | Watanabe et al. | 307/296.6 |
| 5,119,265 | 6/1992 | Qualich et al. | 361/103 |
| 5,159,520 | 10/1992 | Toyooka et al. | 361/103 |

OTHER PUBLICATIONS

"A Smarter Bipolar Stepper Motor Driver" PCIM'88 Proceedings by Gilles Troussel pp. 23–31.

Primary Examiner—Thomas G. Black
Assistant Examiner—Julie D. Day
Attorney, Agent, or Firm—Antonelli, Terry, Stout & Kraus

[57] ABSTRACT

A semiconductor integrated circuit has a semiconductor output device (3), a sensor (5) generating an electric signal (7) relevant to heat generation (6) of the output device (3) and a microprocessor unit MPU 2, inside a chip (1). The MPU (2) is constructed of a memory (20) and CPU (22). The electric signal (7) generated from the sensor (5) is processed by the CPU (22) in accordance with a stored program of the memory (20). Accordingly, the drivability of the semiconductor output device (3) can be set in an optimum state corresponding to changes in chip temperature including changes that are only momentary.

4 Claims, 6 Drawing Sheets

SEMICONDUCTOR INTEGRATED CIRCUIT HAVING SEMICONDUCTOR OUTPUT DEVICE DRIVING EXTERNAL LOAD AND MICROPROCESSOR UNIT

This application is a continuation of application Ser. No. 785,808, filed on Oct. 31, 1991, now abandoned.

BACKGROUND OF THE INVETION

FIELD OF THE INVETOIN

The present invention relates to a technique of control of chip temperature of a semiconductor integrated circuit having a high power semiconductor output device (power operation) and a controller controlling the output device.

DESCRIPTION OF THE PRIOR ART

A conventional semiconductor integrated circuit having a high power semiconductor output device (power operation), the controller controlling the device and a unit for detecting and controlling chip temperature, is disclosed in PCIM' 88 PROCEEDINGS, PP. 23-31, 1988.

According to this prior art, an alarm signal is delivered when a semiconductor chip temperature becomes 140° C. or above, and the semiconductor output device is put in an "OFF" state when the semiconductor chip temperature becomes 170° C.-180° C. or above. When the semiconductor chip temperature lowers to 30° C. thereafter, the semiconductor output device is put in an "ON" state again.

SUMMARY OF THE INVENTION

According to the above-stated prior art, the semiconductor output device conducting a power operation is put in the "OFF" state only when the chip temperature of the semiconductor integrated circuit having the semiconductor output device rises to a setting temperature of 170° C.-180° C. or above, and control of the power operation of the semiconductor output device corresponding to the chip temperature is not conducted, even though detection of the chip temperature is executed, when the semiconductor chip temperature is below the setting temperature.

Even when the semiconductor chip temperature rises near to the setting temperature due to abnormality of an external load driven by the semiconductor output device or due to an abnormal rise in a supply voltage or the like, accordingly, a limiting operation of the semiconductor output device is not started at all, and the semiconductor output device is put in the "OFF" state only when the semiconductor chip temperature exceeds the setting temperature.

In the prior art, as described above, the limiting operation is divided definitely, with the setting temperature as a boundary, into an operation area wherein the limiting operation of the semiconductor output device is not conducted at all and an operation area wherein a 100% limiting operation ("OFF" control) of the semiconductor output device is conducted. The present inventors have determined that there is a problem in this prior art system in that an operation control of the semiconductor output device of high function corresponding to the chip temperature changing momentarily is impossible.

The present invention has been made on the basis of results of examination by the present inventors as described above, and is aimed at furnishing a semiconductor integrated circuit having a chip temperature control function of high grade.

The semiconductor integrate circuit being typical of the inventions disclosed in the present application has
- a semiconductor output device (3) driving an external load (12),
- a sensor (5) generating an electric signal (7) relevant to heat generation (6) of said semiconductor output device (3), and
- a microprocessor unit (2) constructed at least of a memory (20) and CPU (22), inside a chip (1),
  wherein the aforesaid electric signal (7) generated from the aforesaid sensor (5) is processed in the aforesaid CPU (22) in accordance with a stored program of the aforesaid memory (20) and
  wherein the drivability of the aforesaid semiconductor output device (3) is set in accordance with the result of said processing.

A program for executing a chip temperature control can be stored in the memory (20) of the microprocessor unit (2), and therefore the electric signal (7) generated from the sensor (5) is processed in the CPU (22) in accordance with the stored program of this memory (20).

Accordingly, the drivability of the semiconductor output device (3) can be set in the optimum state corresponding to changes in the chip temperature including momentary changes, and thus a semiconductor integrated circuit having a chip temperature control function of high grade can be furnished.

Besides, it is also possible to limit stepwise the drivability of the semiconductor output device (3) corresponding to the rise in the chip temperature, and it is possible further to enlarge remarkably an operation range in which the semiconductor output device (3) can drive the external load (12), in comparison with a simple "ON-OFF" control with the setting temperature as a boundary, which is one of conventional techniques.

Other objects and distinctive features of the present invention will be apparent from the following embodiments.

DESCRIPTION OF THE PREFERRED EMBODIMENTS

The embodiments of the present invention will be described in detail hereunder with reference to the drawings.

Figure 1:
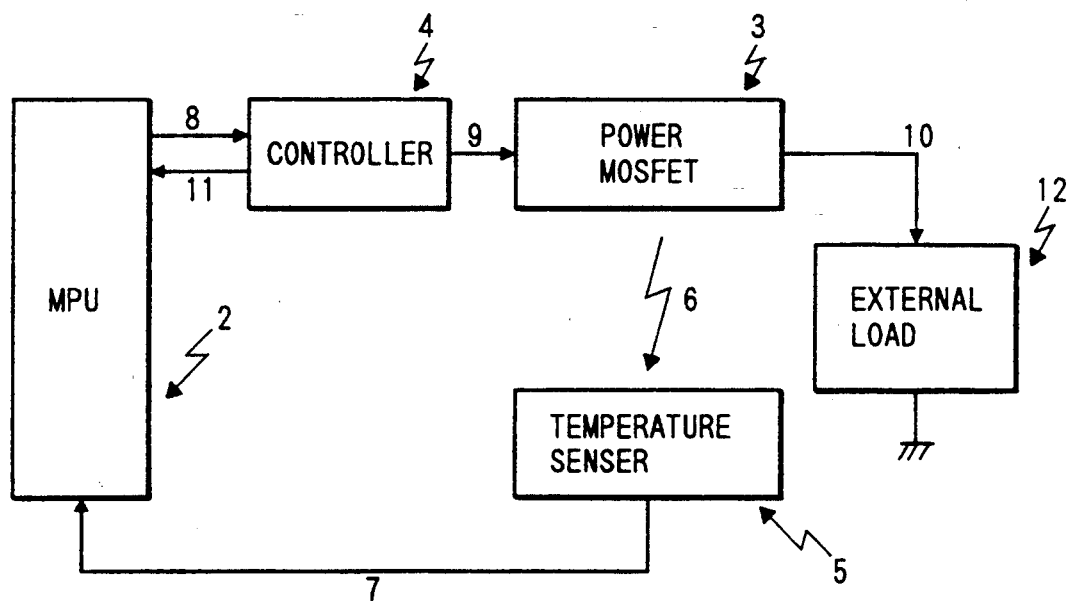
FIG. 1 is a block diagram showing a circuit construction of a semiconductor integrated circuit according to one embodiment of the present invention.

FIG. 1 is a block diagram showing a circuit construction of a semiconductor integrated circuit according to one embodiment of the present invention.

As shown in FIG. 1, a control signal 9 serving from a controller 4 is supplied to power MOSFET 3 as a semiconductor output device, and an output signal 10 of the power MOSFET 3 thus generated drives an external load 12 such as a motor. With the drive of the external load 12, heat 6 generated from the power MOSFET 3 is transmitted to a chip temperature sensor 5 inside a semiconductor chip. This generated heat is converted into an electric signal 7 by this sensor 5.

The chip temperature sensor 5 is preferably a ring oscillator of MOSFET construction, for instance, and an oscillating frequency of the ring oscillator 5 lowers in response to an increase in the heat 6 generated from the power MOSFET 3.

The electric signal 7 of the sensor 5 is transmitted to a microprocessor unit (MPU) 2 and processed by a central processing unit (CPU) inside the MPU 2 in accordance with a stored program of a memory inside the MPU 2, and a control signal 8 to be supplied to the controller 4 is outputted from the MPU 2.

Besides, an interruption signal 11 is supplied from the controller 4 to the MPU 2.

Figure 2:
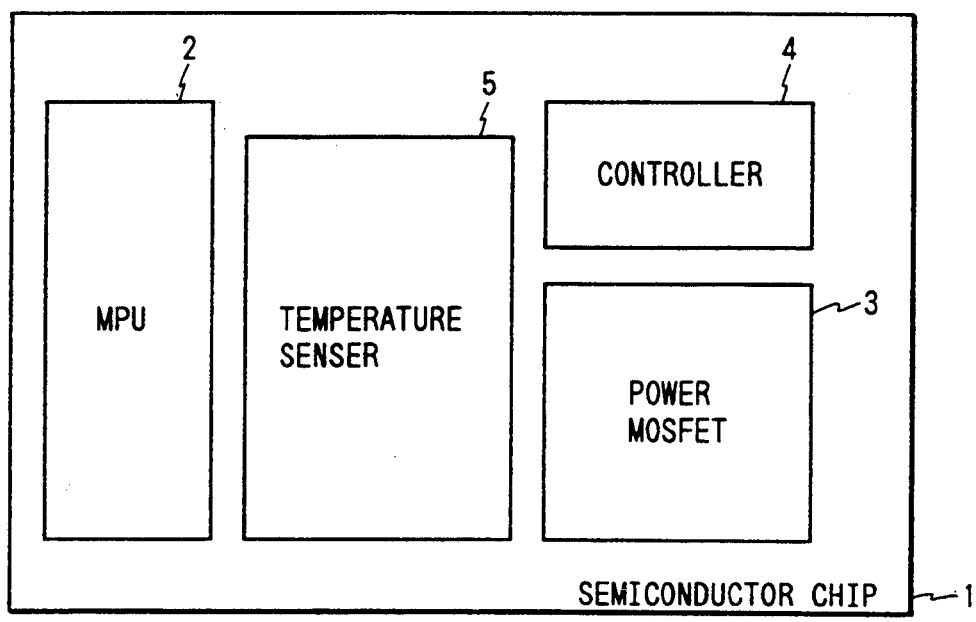
FIG. 2 is a top view of a semiconductor chip showing a simplified circuit layout of the semiconductor integrated circuit according to one embodiment of the present invention shown in FIG. 1.

FIG. 2 is a top view of a semiconductor chip showing a simplified circuit layout of the semiconductor integrated circuit according to one embodiment of the present invention shown in FIG. 1, and the MPU 2, the chip temperature sensor 5, the controller 4 and the power MOSFET 3 are disposed on the top of the semiconductor chip 1. The temperature sensor 5, which is disposed adjacently to the power MOSFET 3, is set desirably in the center. This is because the temperature is highest therein.

Figure 3:
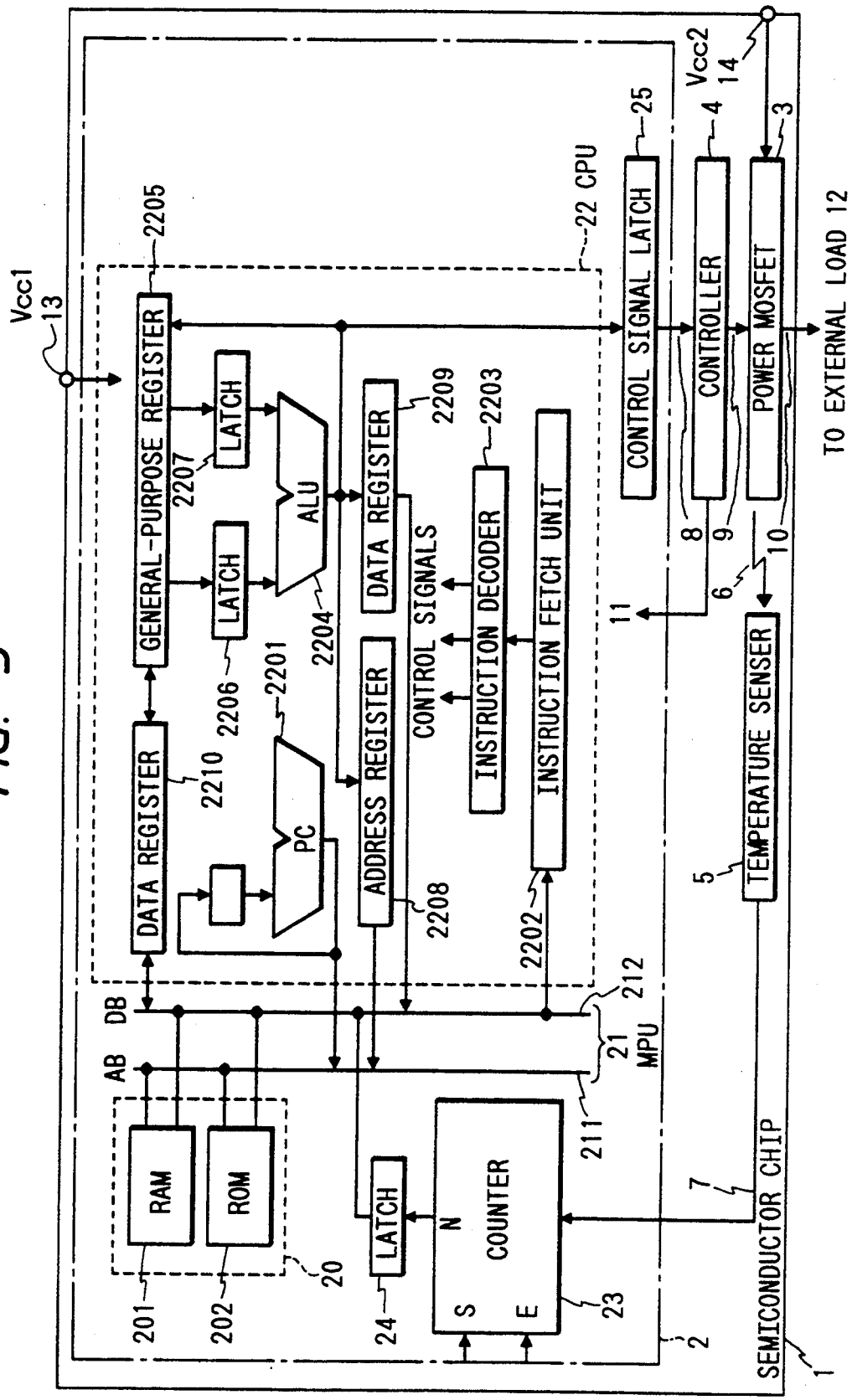
FIG. 3 is a block diagram showing the construction of the MPU of FIGS. 1 and 2 in more detail.

FIG. 3 is a block diagram showing the construction of the microprocessor unit (MPU) of FIGS. 1 and 2 in more detail; as can be seen the MPU 2 is preferably constructed of a memory 20, a bus 21, a central processing unit (CPU) 22, a counter 23, a latch 24, a control signal latch 25, etc.

The memory 20 stores instructions of a semiconductor chip temperature detection control program to be described in detail with reference to FIG. 4 or others, and also stores calculation data (e.g. data corresponding to chip temperatures of 100° C., 130° C., 160° C. and 180° C.) of the CPU 22.

Moreover, the memory 20 comprises RAM 201 and ROM 202. In the case when an instruction program is prepared by a semiconductor maker, this instruction program is stored in the ROM 202. In the case when a user desires an inherent instruction program, the inherent instruction program may be written in the ROM 202 constructed also of an EPROM, EEPROM or the like, or in the RAM 201.

The bus 21 comprises an address bus (AB) 211 and a data bus (DB) 212.

The CPU 22 accesses the memory 20 by delivering an address signal to the address bus (AB) 211, and it reads out instructions or data from the memory 20 and calculates them, while writing data on calculation results in the memory 20.

In order to read out instructions to be succeedingly executed from the memory 20, a program counter 2201 accesses the memory 20 by delivering an instruction address signal to the address bus 211. In the case when the instructions are read out sequentially, this program counter 2201 makes an increment of a constant value for an instruction address, while it outputs an address of a branch target instruction in the case when the branch target instruction is read out in response to a conditional branch instruction.

The instruction read out of the memory 20 in accordance with the address of the program counter 2201 is fetched by an instruction fetch unit 2202 and then decoded by an instruction decoder 2203. A decoded result thus obtained is a control signal for controlling an arithmetic and logic unit (ALU) 2204 and others.

A general purpose register comprises eight registers R0, R1 to R7, and it is provided for storing data before calculation supplied to the ALU 2204 through latches 2206 and 2207 and data being the calculation result of the ALU 2204. It is called also a register file.

In the case when the calculation result of the ALU 2204 is an operand address for accessing the memory 20, this operand address is delivered to the address bus (AB) 211 through a memory address register 2208. When the calculation result of the ALU 2204 is operand data to be written in the memory 20, on the other hand, the operand data are delivered to the data bus (DB) 212 through a memory data register 2209. When the calculation result of the ALU 2204 is operand data to be written in the general purpose register 2205, the operand data are delivered directly to the general purpose register 2205. When the calculation result of the ALU 2204 is data for controlling the drivability of the power MOSFET 3, it is delivered directly to the control signal latch circuit 25.

In accordance with the heat 6 generated from the power MOSFET 3, an oscillating frequency f of an oscillation signal 7 of the ring oscillator 5 is determined. In order to determine the semiconductor chip temperature corresponding to the oscillating frequency f of this oscillation signal 7, the oscillation signal 7 of the ring oscillator 5 is pulse-counted for t seconds. The start and the end of this pulse count can be specified by supplying a control signal to a starting terminal S and an ending terminal E of the counter 23. This control signal can be obtained also from the instruction decoder 2203 of the CPU 22. A pulse count number N determined in this way is supplied to the general purpose register 2205 through the latch circuit 24, the data bus (DB) 212 and a data register 2210.

In accordance with the pulse count number N supplied to the general purpose register 2205 in this way and with instructions of the semiconductor chip temperature detection-control program to be described in detail with reference to FIG. 4 or others, the CPU 22 calculates data for controlling the drivability of the power MOSFET 3 and delivers the data to the control signal latch circuit 25.

This data is transmitted as a control signal 8 to the controller 4 through the control signal latch circuit 25, a control signal 9 is supplied from the controller 4 to the power MOSFET 3 and thereby the load drivability of the external load 12 of the power MOSFET 3 is controlled.

A first external power supply terminal 13 and a second external power supply terminal 14 are provided for supplying a supply voltage to the MPU 2 and the power MOSFET 3 discretely.

Besides, the supply voltage supplied from the first external power supply terminal 13 can be supplied also to the memory 20.

A parasitic resistance of an internal power supply wiring of the semiconductor integrated circuit can not be neglected. If a common supply voltage is supplied to the MPU 2 and the power MOSFET 3 from a common external power supply terminal, therefore, supply noise caused by a power operation of the power MOSFET 3 is transmitted through the power supply wiring common to the MPU 2 and cause malfunction of the MPU 2.

By providing the semiconductor chip 1 with the first external power supply terminal 13 and the second external power supply terminal 14, in contrast, it becomes possible to prevent the malfunction of the MPU 2 due to the supply noise. It is also possible to supply a stable supply voltage $Vcc_1$ of 5 volts, for instance, to the first external power supply terminal 13 and to supply a high voltage $Vcc_2$ of 50 volts necessary for the power operation of the power MOSFET 3 to the second external power supply terminal 14.

The semiconductor chip temperature detection-control program will be described in detail hereunder with reference to FIG. 4.

Figure 4:
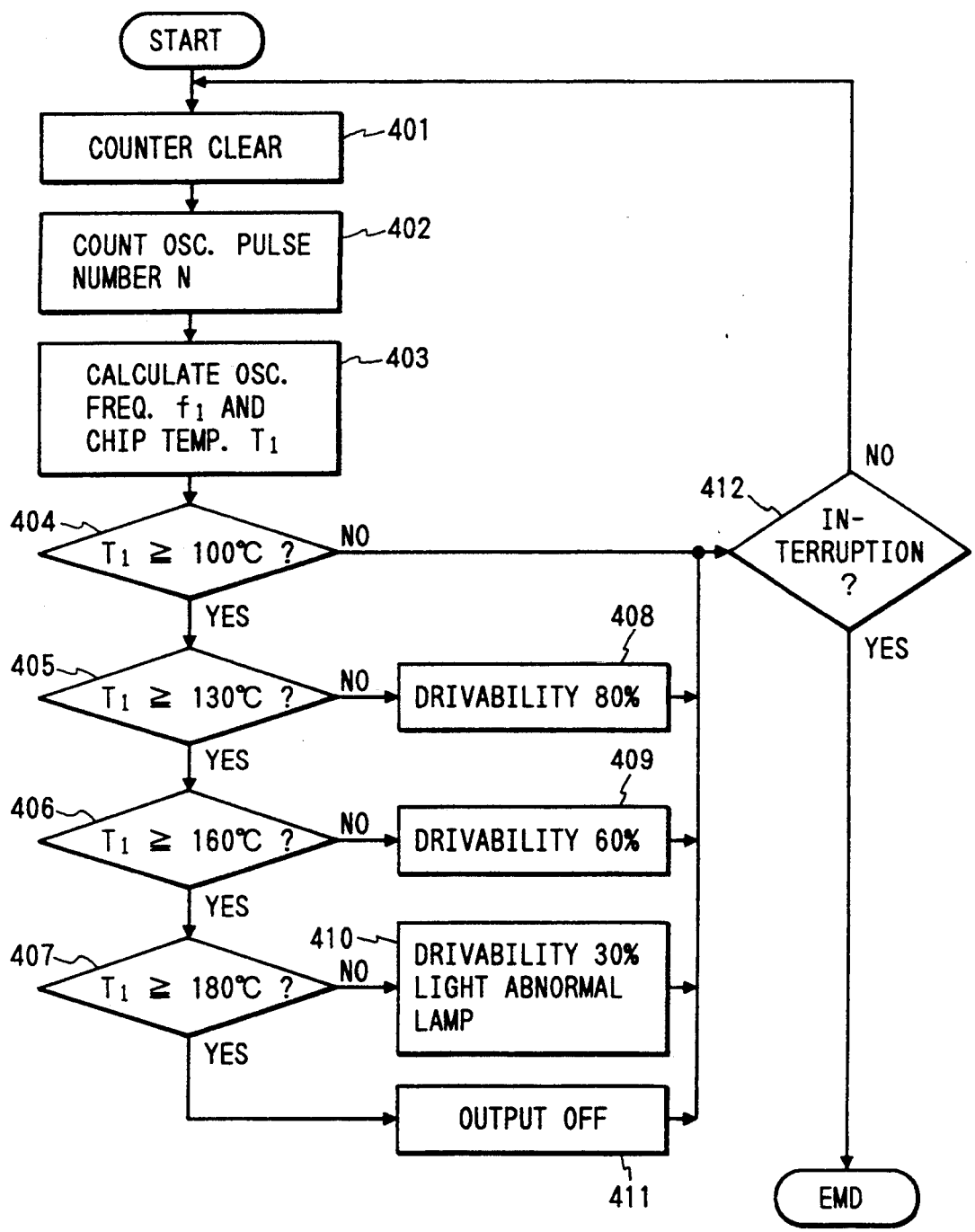
FIG. 4 is an illustration showing the process of a semiconductor chip temperature detection-control program stored in a memory of the MPU of the embodiment of FIGS. 1 to 3.

When the semiconductor chip temperature detection-control program is started, the counter 23 of the MPU 2 of FIG. 3 is cleared and the pulse count number N is set to be zero at a step 401, as shown in FIG. 4.

At a step 402, an oscillation output 7 of the ring oscillator 5 is counted for t seconds.

At a step 403, an oscillating frequency $f_1$ of the oscillating output 7 of the ring oscillator 5 and a chip temperature $T_1$ are calculated.

The oscillating frequency $f_1$ is determined from the pulse count number N for t seconds and the time of t seconds according to the following equation.

$$f_1 = N/t \quad (1)$$

The semiconductor chip temperature $T_1$ can be calculated from the oscillating frequency $f_1$ of the ring oscillator 5 in the following way.

An oscillating frequency f of the CMOS ring oscillator 5 is expressed by the following equation in accordance with the dependence of the carrier mobility $\mu$ of a semiconductor on a temperature T.

$$f = K \cdot T^{-3/2} \quad (2)$$

In this equation, mark k is a constant.

Accordingly, the following equation is established in regard to a known oscillating frequency $f_0$ of the CMOS ring oscillator 5 at a known temperature $T_0$, as well.

$$f_0 = k \cdot T_0^{-3/2} \quad (3)$$

On the other side, the following equation is established between the oscillating frequency $f_1$ calculated by the above-stated equation and made known and an unknown temperature $T_1$, as well.

$$f_1 = k \cdot T^{-3/2} \quad (4)$$

Accordingly, the temperature $T_1$ can be calculated according to the following equation on the basis of the above-stated equations (3) and (4).

$$T_1 = T_0 (f_0/f_1)^{2/3} \quad (5)$$

At a step 404, it is determined whether the chip temperature $T_1$ calculated at the step 403 is 100° C. or above. When the result of determination is NO, a processing is transferred to the right, and when it is YES, the processing transfers to a step 405.

At a step 405, it is determined whether the chip temperature $T_1$ calculated at the step 403 is 130° C. or above. When the result is NO, the processing transfers to a step 408 on the right (for a processing of limiting the drivability of the power MOSFET 3 to 80%), and when YES, the processing transfers to a step 406.

At the step 406, it is determined whether the chip temperature $T_1$ calculated at the step 403 is 160° C. or above. When the result is NO, the processing transfers to a step 409 on the right (for a processing of limiting the drivability of the power MOSFET 3 to 60%), and when YES, it transfers to a step 407.

At the step 407, it is determined whether the chip temperature $T_1$ calculated at the step 403 is 180° C. or above. When the result is NO, the processing transfer to a step 410 on the right (for a processing of limiting the drivability of the power MOSFET 3 to 30% and lighting an abnormal lamp), and when YES, it transfers to a step 411.

At this step 411, the power MOSFET 3 is put in an "OFF" state and the drivability thereof is limited to zero percent.

By the operations of limiting the drivability of the power MOSFET 3 by the steps 408, 409, 410 and 411 described above, an abnormal rise in the semiconductor chip temperature and breakdown of the device due to abnormality of the external load or an abnormal rise in the supply voltage can be prevented.

After the operations described above, the presence or absence of an interruption signal 11 from the controller 4 is detected at a step 412, and when the signal is absent, the processing returns to the step 401. When the signal is present, the processing of this program is ended and a transfer is made to a processing corresponding to the interruption signal 11.

Figure 5A:
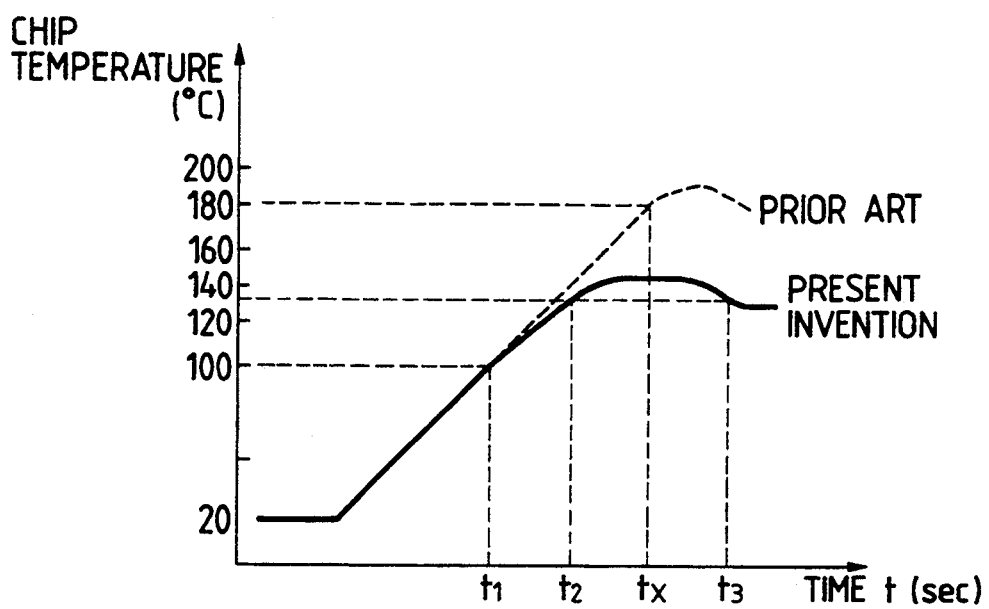
FIGS. 5 (A) and (B) are graphs showing changes in drivability of a power MOSFET in relation to a rise in chip temperature in the cases of a prior art device and the present embodiment of FIGS. 1 to 4.
Figure 5B:
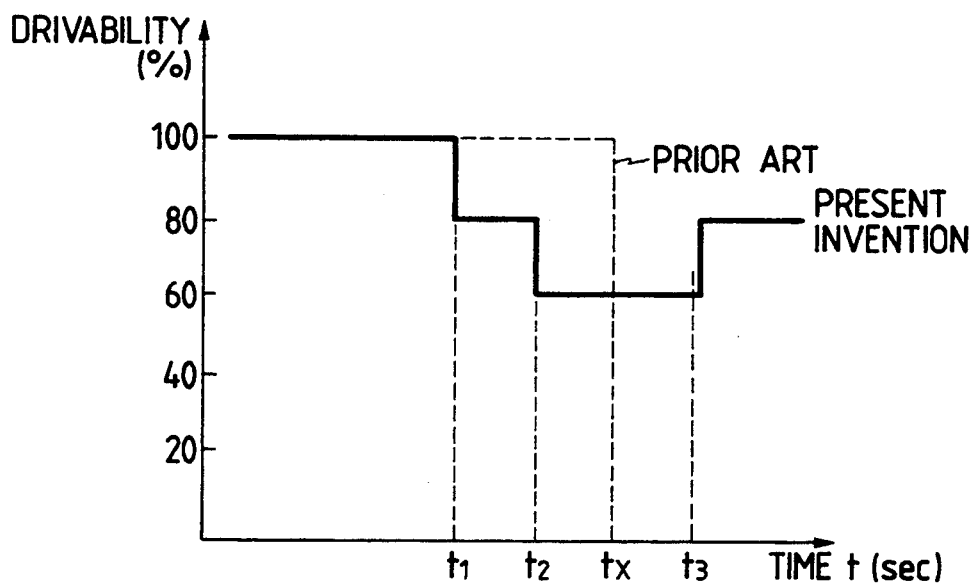

FIGS. 5 (A) and (B) show changes in the drivability of the power MOSFET for the rise in the chip temperature in the cases of the prior art and the present embodiment.

In FIGS. 5 (A) and (B), a broken line shows the prior art and a solid line shows the present embodiment.

According to the prior art, as shown by the broken line, a sharp control is conducted wherein the drivability does not change when the semiconductor chip temperature is below 180° C., and turns to be zero percent with the power MOSFET shut down when the temperature becomes 180° C. or above.

According to the present embodiment, as shown by the solid line, the drivability is set stepwise with the rise in the semiconductor chip temperature. Therefore, an effect of preventing a sharp rise in the semiconductor chip temperature is produced and also it is unnecessary to limit the drivability of the power MOSFET to zero completely in almost all cases.

It is a matter of course that the present invention is not limited to the above-described concrete embodiment and that a variety of variants can be formed within the domain of the technical idea thereof.

For instance, the means to control the drivability of the power MOSFET to be zero percent is not limited to the MPU 2. A shut down circuit using p-n junction, for instance, can be employed also as this means. This shut down circuit shuts off the power MOSFET when the semiconductor chip temperature is to be 180° C. or above.

As for the means to control the drivability of the power MOSFET stepwise within the range of the chip temperature from 100° C. to 180° C., the stored program of the memory of the MPU 2 shown in the embodiment of FIGS. 1 to 3 can be used.

Moreover, the ring oscillator 5 as a temperature sensor can be used also as a clock generator for the MPU 2. In such a case, it is necessary to set a connection stage number N of the ring oscillator and a size and a load capacity of a transistor so that the upper limit of the oscillating frequency of the ring oscillator 5 generated with the rise in the temperature may not exceed an operating upper limit frequency of the MPU 2.

Besides, it is also useful to provide a circuit not only for detection and control of the temperature of the power MOSFET, but also for detection and control of an overcurrent and an overvoltage.

As for the semiconductor output device 3 driving the external load 12, moreover, a bipolar power transistor can also be used therefor other than the power MOSFET.

Another embodiment of the present invention will now be described hereunder with reference to FIGS. 6 to 8.

Figure 6:
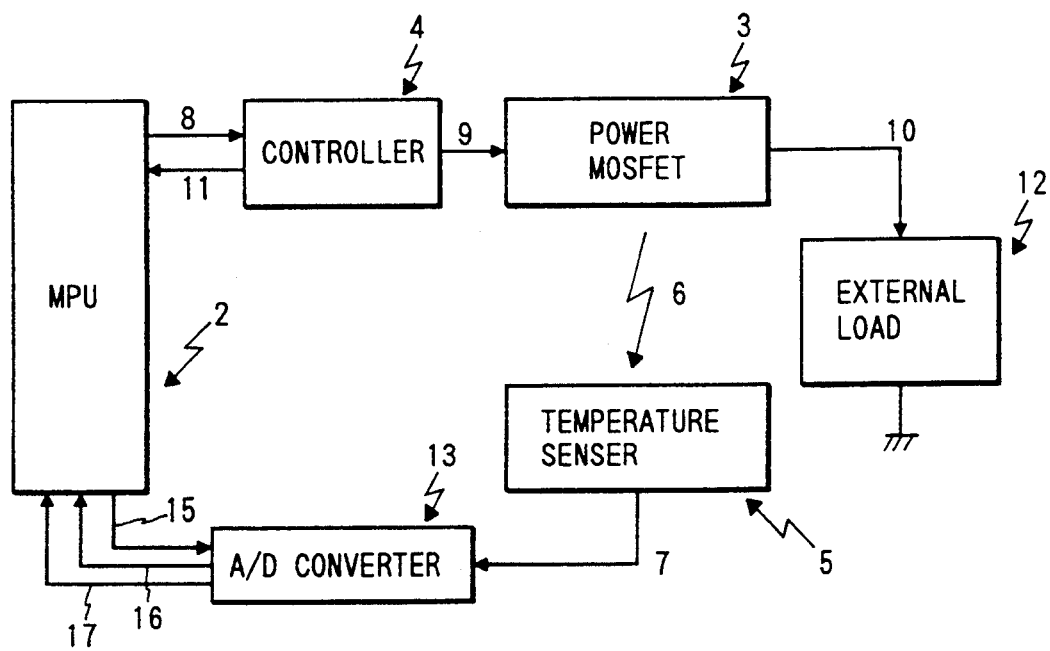
FIG. 6 is a block diagram showing a circuit construction of a semiconductor integrated circuit according to a second embodiment of the present invention.

FIG. 6 is a block diagram showing a circuit construction of a semiconductor integrated circuit according to another embodiment of the present invention.

As shown in FIG. 6, a control signal 9 from the controller 4 is supplied to the power MOSFET 3 as the semiconductor output device and thereby an output signal 10 of the power MOSFET 3 is made to drive the external load 12 such as a motor. With the drive of the external load 12, heat 6 generated from the power MOSFET 3 is transmitted to the chip temperature sensor 5 inside the semiconductor chip and converted into an electric signal 7 by this sensor 5.

The chip temperature sensor 5 is a p-n junction or a semiconductor diffusion resistor, for instance, and the electric signal 7 from the sensor 5 is an analog signal. An A/D converter 13 of 8 bits converts the analog electric signal 7 from the sensor 5 into a digital signal 17 and then delivers this digital signal 17 to the MPU 2. A convert start signal 15 is delivered from the MPU 2 to the A/D converter 13, while a convert finish signal 16 is delivered from the A/D converter 13 to the MPU 2.

The digital signal 17 of the A/D converter 13 is transmitted to the microprocessor unit (MPU) 2 and processed by the CPU inside the MPU 2 in accordance with the stored program of the memory inside the MPU 2, and a control signal 8 to be supplied to the controller 4 is outputted from the MPU 2.

Furthermore, an interruption signal 11 is supplied from the controller 4 to the MPU 2.

Figure 7:
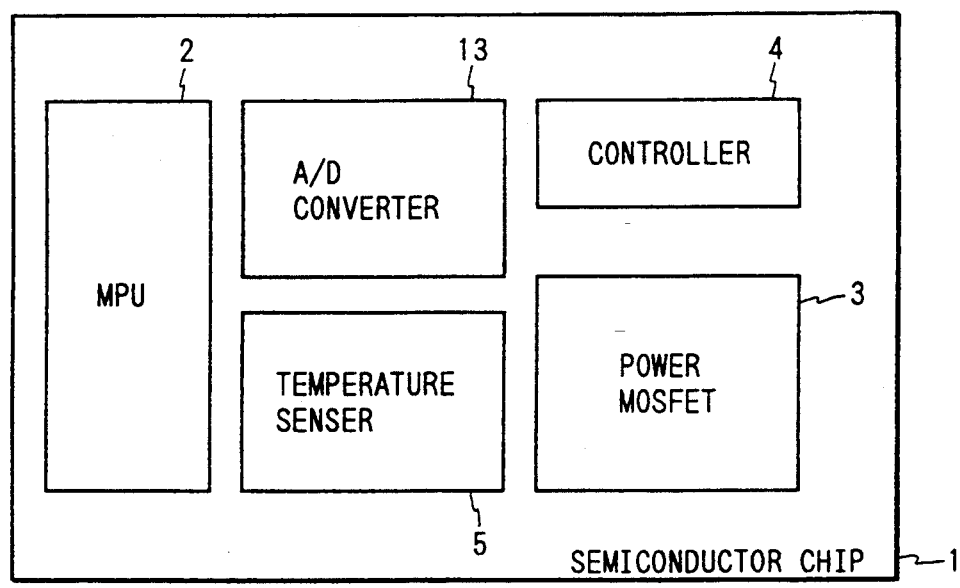
FIG. 7 is a top view of a semiconductor chip showing a simplified circuit layout of the semiconductor integrated circuit according to the second embodiment of the present invention shown in FIG. 6.

FIG. 7 is a top view of a semiconductor chip showing a simplified circuit layout of the semiconductor integrated circuit according to the second embodiment of the present invention shown in FIG. 6, and the MPU 2, the chip temperature sensor 5, the A/D converter 13, the controller 4 and the power MOSFET 3 are disposed on the top of the semiconductor chip 1.

In the case when the chip temperature sensor 5 is a circuit using the p-n junction in the embodiment of FIGS. 6 and 7, a temperature change rate $\alpha$ of a forward voltage $V_1$ of the p-n junction is about $-2$ mV/°C. Accordingly, it is possible to calculate the chip temperature by the MPU 2 from a temperature change in the forward voltage $V_1$ of the p-n junction after the A/D conversion by the A/D converter 13. As for the p-n junction of the chip temperature sensor 5, a p-n junction diode between the base and the emitter of an n-p-n bipolar transistor of which the base and the collector are short-circuited can be used.

In the case when the chip temperature sensor 5 is a circuit using the semiconductor diffusion resistor in the embodiment of FIGS. 6 and 7, a temperature change rate $\beta$ of a resistance value of the semiconductor diffusion resistor is about 0.3%/°C. Accordingly, the semiconductor chip temperature can be calculated by making a constant current flow into the semiconductor diffusion resistor from a constant current circuit to generate a constant voltage and by detecting a temperature change in this constant voltage. In other words, the semiconductor chip temperature can be calculated by the MPU 2 from the temperature change in the constant voltage of the semiconductor diffusion resistor after the A/D conversion by the A/D converter 13.

A detailed description will be made hereunder on a semiconductor chip temperature detection-control program in the embodiment of FIGS. 6 and 7 with reference to FIG. 8.

Figure 8:
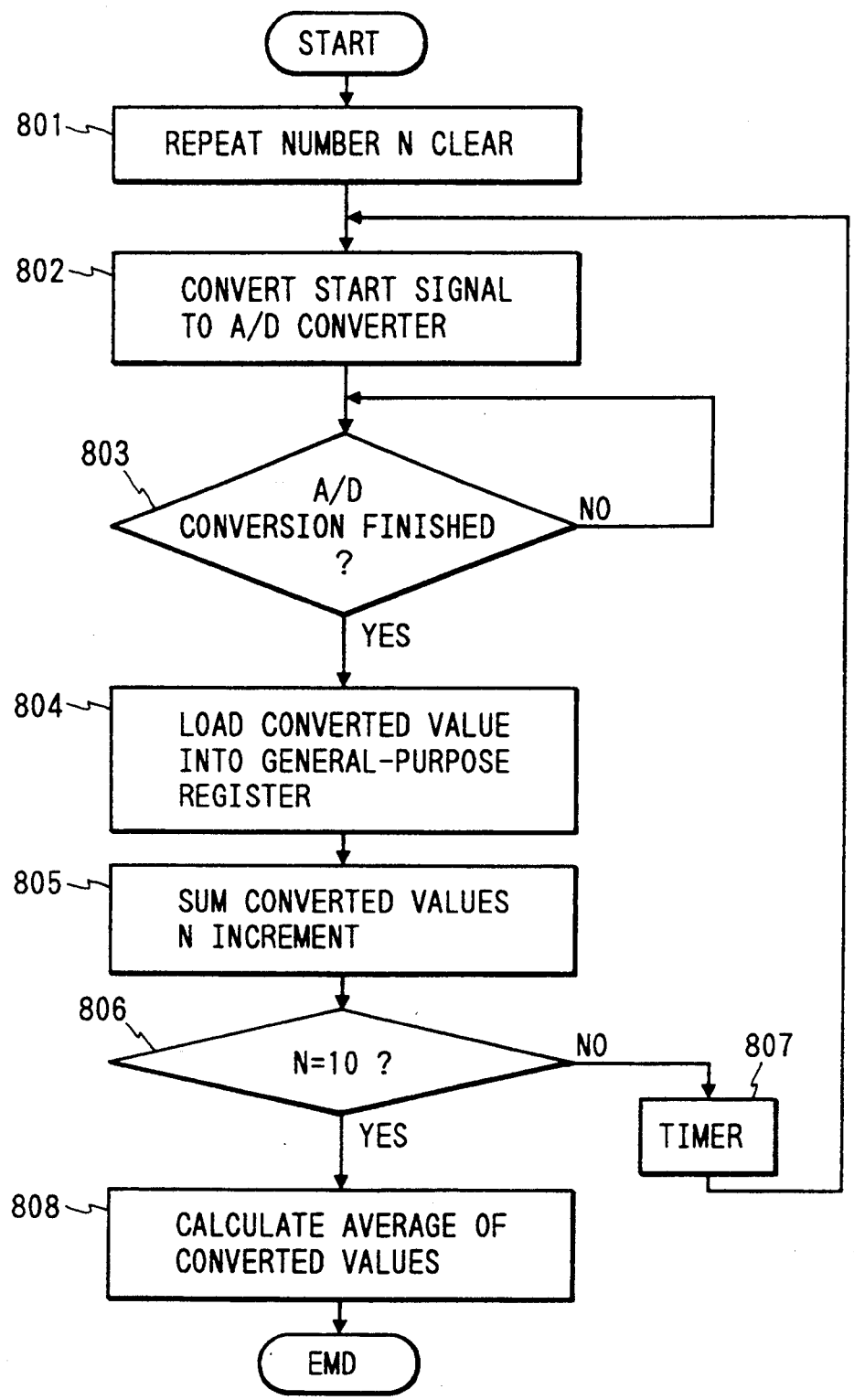
FIG. 8 is a flowchart showing the process of a semiconductor chip temperature detection-control program in the second embodiment of the present invention of FIGS. 6 and 7.

When the semiconductor chip temperature detection-control program is started, a repeat number N is cleared at a step 801, as shown in FIG. 8.

At a step 802, the MPU 2 delivers the convert start signal 15 to the A/D converter 13.

At a step 803, it is detected whether or not an A/D conversion operation of the A/D converter 13 is finished, by monitoring the convert finish signal 16 from the A/D converter 13. When the operation is finished, a processing transfers to a step 804.

At the step 804, an A/D conversion output of the A/D converter 13 is loaded on one of general purpose registers of the MPU 2 and the processing transfers to a step 805.

At the step 805, the A/D conversion output loaded on the general purpose register of the MPU 2 at the step 804 and a zero are added up by the CPU of the MPU 2 when the repeat number N is zero, and the result of the addition is loaded on another general purpose register of the MPU 2. Thereafter the repeat number N is incremented by +1.

When the repeat number N is 1, at the step 805, the A/D conversion output loaded on the general purpose register of the MPU 2 at the step 804 and the addition result loaded on another general purpose register of the MPU 2 in a cycle of N=0 are added up by the CPU of the MPU 2, and the fresh addition result is loaded again on other one of the general purpose registers of the MPU 2. Thereafter the repeat number N is incremented by +1.

At a step 806, it is detected whether or not the repeat number N is 10. When the repeat number N is not 10, the processing is returned to the step 802 after a prescribed time set by a timer at a step 807. When the repeat number N is 10, the processing is transferred to a step 808.

At the step 808, the addition result loaded on other one of the general-purpose registers of the MPU 2 is divided by the repeat number N and thereby an average of the A/D conversion output is determined. By determining the average of the A/D conversion output in this way, an effect of undesired noise accompanying the A/D conversion can be reduced.

After the average of the A/D conversion output is determined at the step 808, the chip temperature is determined in the same way substantially as in the embodiment of FIGS. 1 to 4 and the drivability of the power MOSFET is limited stepwise.

It is a matter of course, according to the present invention, that not only the program for executing the chip temperature control, but also other program instructions, can be stored in the memory 20 of the MPU 2.

As for examples of other programs, there is a program for a sequence control of the external load 12 or a program for a control of rotation of a motor in the case when the external load 12 is the motor.

The program for executing the chip temperature control and other program can be executed also on the basis of a time-share system by the MPU 2.

In regard to a method of setting the drivability of the power MOSFET, it can be set by setting the pulse width of an input signal to be impressed on a gate of the power MOSFET in the case of a PWM drive. In another example, it can be set also by making variable a voltage level of the input signal to be impressed on the gate of the power MOSFET.

Since the program for executing the chip temperature control can be stored in the memory of the MPU, according to the present invention, the electric signal generated from the sensor is processed by the CPU in accordance with the stored program of this memory.

Accordingly, the drivability of the semiconductor output device can be set in an optimum state corresponding to changes in chip temperature including momentary changes, and thus the semiconductor integrated circuit having a semiconductor chip temperature control function of high grade can be furnished.

What is claimed is:

1. A semiconductor integrated circuit chip comprising:
  a semiconductor output device driving an external load;
  a sensor for sensing heat generated by said semiconductor output device, and
  a microprocessor unit including at least a memory, a counter and a CPU,
  wherein said semiconductor output device is a power MOSFET,
  wherein said sensor is a ring oscillator generating an oscillation signal, and oscillation frequency of which is dependent on said heat generated by said power MOSFET,
  wherein said oscillation signal of said ring counter is counted by said counter,
  wherein digital count data of said counter based on said oscillation signal of said ring oscillator is compared with a plurality of comparison levels by said CPU in accordance with a stored program of said memory, and
  wherein driveability of said power MOSFET is set at a selected one of a plurality of driveability levels corresponding to said plurality of comparison levels in accordance with a result of comparison of said digital count data with said plurality of comparison levels.

2. A semiconductor integrated circuit chip according to claim 1, further comprising:
  a first power supply terminal for supplying a supply voltage to said CPU from outside of the chip; and
  a second power supply terminal for supplying a supply voltage to said power MOSFET from outside of the chip.

3. A semiconductor integrated circuit chip; comprising:
  a semiconductor output device driving an external load;
  a sensor for sensing heat generated by said semiconductor output device, and
  a microprocessor unit including at least a memory, a counter and a CPU,
  wherein said sensor is a ring oscillator generating an oscillation signal, an oscillation frequency of which is dependent on said heat generated by said semiconductor output device,
  wherein said oscillation signal of said ring counter is counted by said counter,
  wherein digital count data of said counter based on said oscillation signal of said ring oscillator is compared with a plurality of comparisons levels by said CPU in accordance with a stored program of said memory, and
  wherein driveability of said semiconductor output device is set at a selected one of a plurality of possible driveability levels, corresponding to said plurality of comparison levels, in accordance with a result of comparison of said digital count data with said plurality of comparison levels.

4. A semiconductor integrated circuit chip according to claim 3, further comprising:
  a first power supply terminal for supplying a supply voltage to said CPU from outside of the chip; and
  a second power supply terminal for supplying a supply voltage to said semiconductor output device from outside of the chip.

* * * * *